(12) United States Patent
Andre

(10) Patent No.: US 7,819,403 B2
(45) Date of Patent: Oct. 26, 2010

(54) INFORMATION CARRYING DEVICE

(75) Inventor: Olivier Andre, Hung Hom (HK)

(73) Assignee: Intermed Asia Ltd., Kowloon (HK)

( * ) Notice: Subject to any disclaimer, the term of this patent is extended or adjusted under 35 U.S.C. 154(b) by 1 day.

(21) Appl. No.: 12/153,622

(22) Filed: May 21, 2008

(65) Prior Publication Data

US 2009/0267298 A1    Oct. 29, 2009

(30) Foreign Application Priority Data

Apr. 28, 2008    (CN)    ............ 2008 2 0112154

(51) Int. Cl.
*A63F 9/08*    (2006.01)
(52) U.S. Cl. ............................................. 273/155
(58) Field of Classification Search ............. 273/153 R, 273/155, 153 S
See application file for complete search history.

(56) References Cited

U.S. PATENT DOCUMENTS

| | | | | |
|---|---|---|---|---|
| 4,063,725 A * | 12/1977 | Snyder | ............ | 273/155 |
| 5,192,077 A * | 3/1993 | Caicedo | ............ | 273/155 |
| 6,544,075 B1 * | 4/2003 | Liao | ............ | 439/638 |
| 6,612,874 B1 * | 9/2003 | Stout et al. | ............ | 439/640 |
| 6,637,138 B2 * | 10/2003 | Prost | ............ | 273/155 |
| 6,648,224 B2 * | 11/2003 | Lee | ............ | 235/451 |
| 6,926,544 B2 * | 8/2005 | Lee | ............ | 439/147 |
| 7,025,275 B2 * | 4/2006 | Huang et al. | ............ | 235/486 |
| 7,179,099 B2 * | 2/2007 | Hsieh | ............ | 439/131 |
| 7,537,169 B2 * | 5/2009 | Gonzalez et al. | ............ | 235/492 |
| 7,568,942 B1 * | 8/2009 | Lannon et al. | ............ | 439/521 |
| 2005/0161513 A1 * | 7/2005 | Huang et al. | ............ | 235/492 |
| 2006/0073717 A1 * | 4/2006 | Ng et al. | ............ | 439/131 |
| 2006/0084284 A1 * | 4/2006 | Hsieh | ............ | 439/31 |

* cited by examiner

*Primary Examiner*—Steven Wong
(74) *Attorney, Agent, or Firm*—Birch, Stewart, Kolasch & Birch, LLP

(57) ABSTRACT

The invention relates to an information carrying device. The information carrying device comprises a device body formed by a puzzle, which can be folded into a plurality of different shapes, wherein the information carrying device further includes a USB storage unit, which can be hidden and thus is invisible from outside when the puzzle is in a first shape, and can be revealed and is ready to interface with an information reader when the puzzle is in a second shape.

6 Claims, 5 Drawing Sheets

INFORMATION CARRYING DEVICE

TECHNICAL FIELD

This invention generally relates to an information carrying device, and more specifically, to an information carrying device including a puzzle.

TECHNICAL FIELD

Puzzle is a kind of popular intelligence toy designed to challenge the user and provide entertainment as well. It can be manipulated by hands of the user so as to display different shapes. Puzzle is popular in both children and adults because it encourages logical thinking, develops spatial relationships, facilitates fine motor skills and provides pure fun. Therefore, each year a lot of puzzles are purchased by people or presented as gifts.

Recently, puzzle is designed as an advertising article by being labeled or printed with advertising information such as text or images on its outer surfaces that can be exposed during folding and shape changing. As puzzle is changing its shape, different texts or images or their combinations will be presented to the user. The changing shapes with different pieces of text or images will give the user a vivid impression and convey different types of advertising information. Therefore, using puzzle as an advertising article makes a success in business.

However, since the area of the outer surfaces of a puzzle that can be exposed during folding and shape changing is limited, the information conveyed by the puzzle is restrained accordingly.

USB storage units or USB-sticks are well-known portable information carrying devices. These USB storage units are usually delicate in their designs, generally including a body and a separate cover to protect the contact of the USB storage units.

When not in use, the cover is positioned on the body to cover the contact of USB storage devices. And when the cover is removed, the contact of the USB storage devices will be exposed so that the contact can be inserted to its corresponding information reader to access the information stored therein. Nonetheless, in practice, because of their delicate designs, the covers and sometimes even the USB-sticks tend to be lost easily.

SUMMARY OF THE INVENTION

The invention aims to provide an information carrying device including a puzzle, which can provide a huge amount of information in a variety of formats.

According to the invention an information carrying device is provided. The information carrying device comprises a device body formed by a puzzle, which can be folded into a plurality of different shapes, wherein the information carrying device further includes a USB storage unit, which can be hidden and thus is invisible from outside when the puzzle is in a first shape, and can be revealed and is ready to interface with an information reader when the puzzle is in a second shape.

In one embodiment, the puzzle is labeled or printed with advertising information. In another embodiment, the USB storage unit contains multimedia information for advertising.

Preferably, the USB storage unit can be revealed in more than one changed shapes of the puzzle.

Preferably, the puzzle includes a plurality of portions connected with each other by folding lines. Further, the puzzle includes a plurality of cutting lines, which, together with the folding lines, enables the puzzle to be turned into different shapes.

With the information carrying device according to the invention, the user can read some information in each folded shape of the puzzle. At the same time, when the puzzle is in the second shape, the contact of the USB storage unit is exposed and can be read by an information reader. Therefore, in addition to the information labeled or printed on the surfaces of the puzzle, the user can further obtain lots of additional information, in particular multimedia information, contained in the USB storage unit. Obviously, this can help the user know more about the advertisement.

In addition, since the USB storage unit is provided within the puzzle, when the puzzle is in its first shape, said USB storage unit is hidden. And this enables the cover for protecting the contact to be spared so that the structure of the USB storage unit can be simplified and the cost for its manufacturing is thus reduced. Further, because the average user will be inclined to play with the puzzle, he or she will become emotionally attached to the puzzle and, consequently, the chance that the puzzle and therewith the USB storage unit will get lost may be reduced.

BRIEF DESCRIPTION OF THE DRAWINGS

The following detailed description of the preferred embodiments of the invention will be better understood when read in conjunction with the attached drawings, which are given for the purpose of illustrating the invention merely. It is understood that the invention is not limited to the precise arrangements and instrumentalities shown in the drawings.

DETAILED DESCRIPTION OF THE PREFERRED EMBODIMENTS

In the following, the information carrying device according to the invention will be discussed in details with reference to the attached drawings.

Figure 1A:
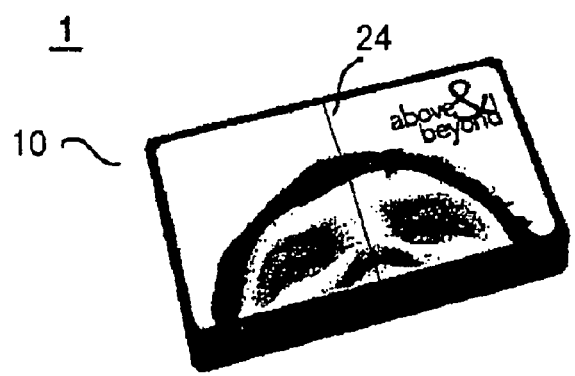
FIGS. 1A to 1C respectively show the first shape, the second shape and the third shape of a preferred embodiment of the information carrying device according to the present invention in perspective view.

FIGS. 1 to 3 show the information carrying device according to a preferred embodiment of the invention. According to the embodiment of the invention, the information carrying device, generally designated with reference number "1", is cuboid-shaped. As shown in FIG. 1A, the information carrying device 1 is in its original shape, i.e., a first shape.

The information carrying device I includes a device body, which is in a form of puzzle 10. The puzzle 10 is cuboid-shaped in its first shape. As a non-limiting example, the puzzle 10 is a cuboid of 86 (L)mm×55 (W)mm×12.5 (H)mm. One skilled in the art can understand that this particular size of the puzzle 10 can be determined as needed.

Figure 1B:
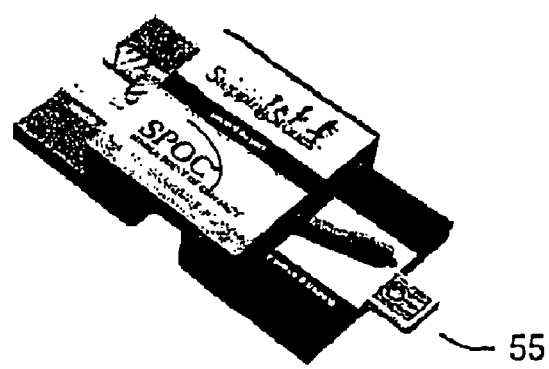
Figure 1C:
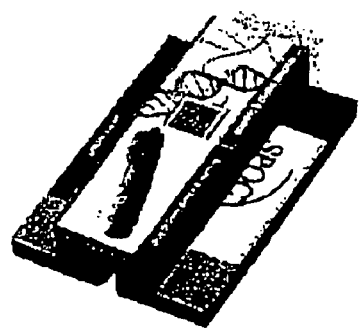

The surfaces of the puzzle 10 are labeled or printed with different pieces of text or images thereon, as shown in FIGS. 1A to 1C. For example, the surfaces of the puzzle 10 are provided with certain pieces of text or images through offset printing to convey the advertising information to the user.

Figure 2C:
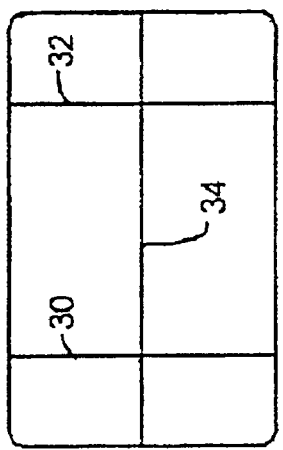
FIGS. 2A to 2D, in plan view respectively, show the information carrying device of FIG. 1A in its first shape.
Figure 2B:
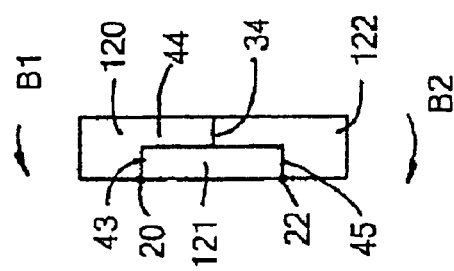
Figure 2A:
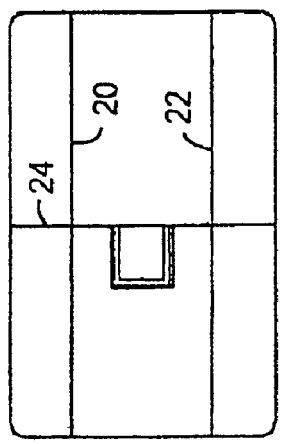

As shown in the top view of the puzzle 10 of FIG. 2A, on the top surface (i.e. the upper surface printed with images in FIG. 1A) of the puzzle 10 there are two horizontal folding lines 20, 22, which are arranged at a distance of, say, slightly less than W/4 from the two horizontal edges of the puzzle respectively, and a vertical cutting line 24, which is centrally arranged.

Moreover, as shown in the bottom view of the puzzle 10 of FIG. 2C, on the bottom surface of the puzzle 10 there are two vertical folding lines 30, 32, which are arranged at a distance of, say, slightly less than L/4 from the two vertical edges of the puzzle respectively, and a horizontal cutting line 34, which is centrally arranged.

Figure 2D:
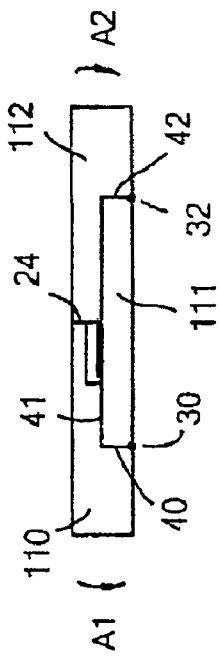

In addition, as shown in the side views of FIGS. 2B and 2D, on the side surfaces of the puzzle 10 there are some additional cutting lines 40-45. With all of these cutting lines 24, 34, 40-45, the puzzle 10 is divided into several portions linked with each other through the folding lines. By means of these folding lines and the cutting lines as well, the puzzle 10 can be changed into several shapes.

The information carrying device 1 further includes a USB (Universal Serial Bus) storage unit 50, which is hidden and invisible from outside when the puzzle is in a first shape, as shown in FIG. 1A. The body of the USB storage unit 50 is inserted into and integrated with the puzzle 10, and the contact 55 of the USB storage unit 50 is received within a recess 56, which is open at the cutting line 24.

Next, the different shapes of the information carrying device 1 will be discussed with reference to the drawings.

Figure 3A:
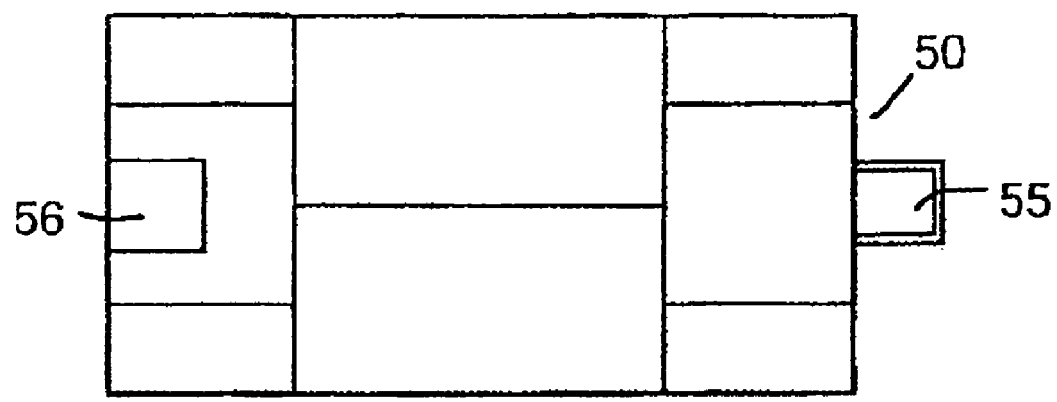
FIGS. 3A and 3B, in plan view respectively, show the information carrying device of FIG. 1A in its second shape, in which the contact of the USB storage unit is exposed.
Figure 3B:
Figure 4A:
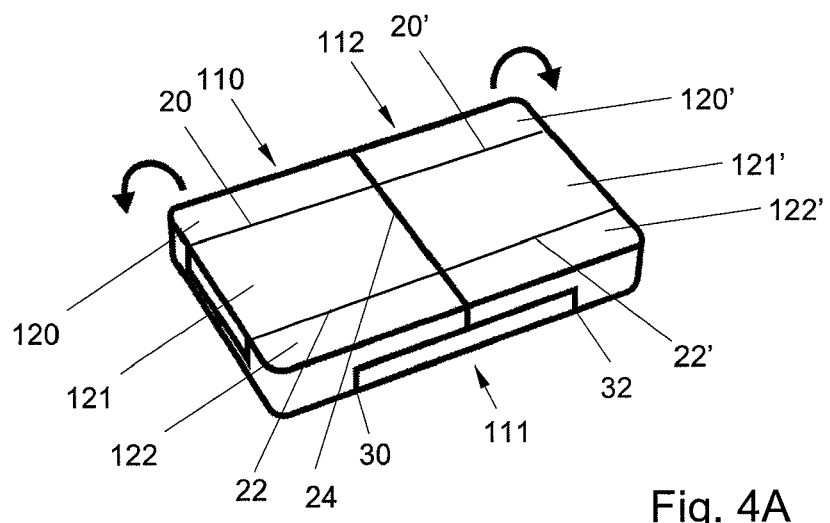
FIGS. 4A-4E depict the puzzle changing from the first shape to the second shape.
Figure 4B:
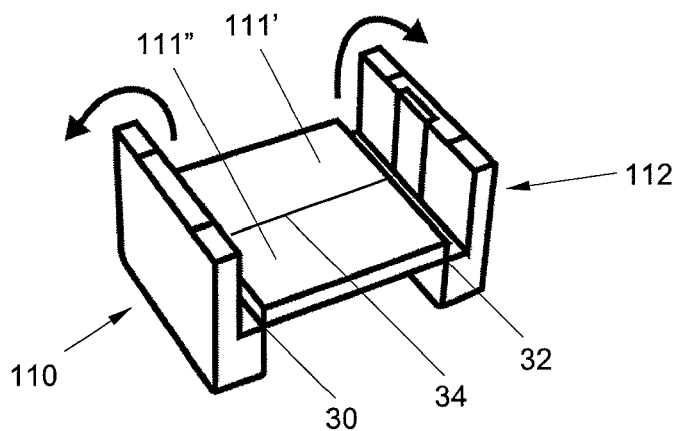
Figure 4C:
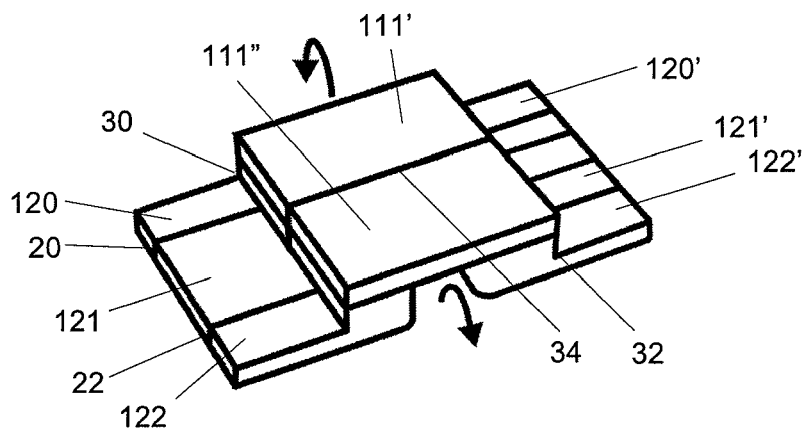
Figure 4D:
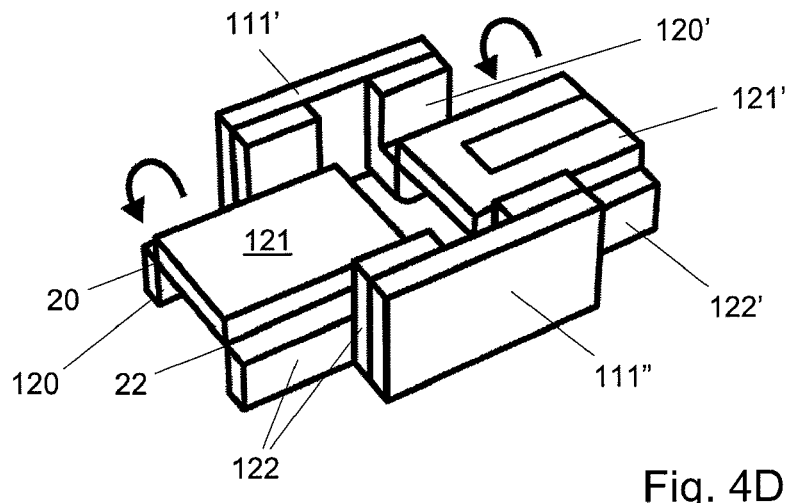
Figure 4E:
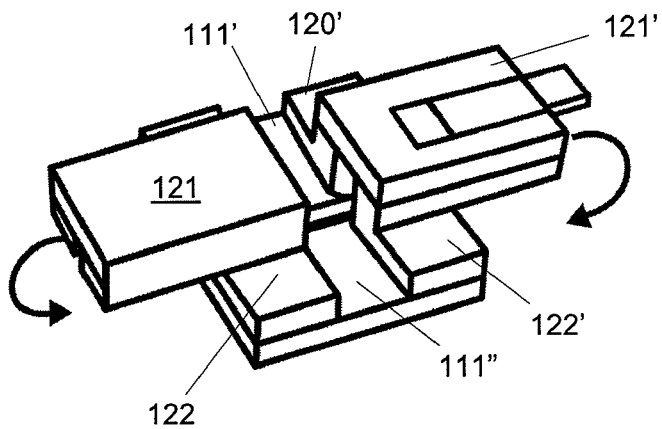

As shown in FIG. 2D, the puzzle 10 is divided into three portions, i.e. a left portion 110, a middle portion 111 and a right portion 112, by the two vertical folding lines 30, 32, which are shown as two points in FIG. 2B, and four cutting lines 40, 41, 42, 24. When the user folds the left portion 110 and the right portion 112 about the vertical folding lines 30, 32 in the directions of arrows A1, A2 respectively until the bottom surfaces of the left portion 110 and a right portion 112 come into contact with the bottom surface of the middle portion 111, the puzzle 10 will be turned into a second shape. FIGS. 1B, 3A and 3B show the puzzle 10 in its second shape, where the cutting line 24 forms the outermost edge of the deformed puzzle.

As the puzzle 10 turns into its second shape, some of its surfaces that are hidden in the first shape are now exposed. Consequently, the user can read and acquire the information labeled or printed on these surfaces hidden in the first shape but now exposed in the second shape. At the same time, the contact 55 of the USB storage unit 50 is released from the recess 56, and thus can be ready for use. Now, the user can insert the contact 55 into an information reader, such as a computer, a mobile phone or an MP4 player, and access the huge amount of information stored in the USB storage unit 50.

Alternatively, as shown in FIG. 2B, the puzzle 10 is also divided into three portions, i.e. a top portion 120, a middle portion 121 and a bottom portion 122, by the two horizontal folding lines 20, 22, which are shown as two points in FIG. 2B, and four cutting lines 43, 44, 45, 34. When the user folds the top portion 120 and the bottom portion 122 about the horizontal folding lines 20, 22 in the directions of arrows B1, B2 respectively until the bottom surfaces of the top portion 120 and the bottom portion 122 come into contact with the bottom surface of the middle portion 121, the puzzle 10 will be turned into a third shape.

FIG. 1C shows the puzzle 10 in its third shape, where the cutting line 34 forms the outermost edge of the deformed puzzle. Some of its other surfaces that are hidden in the first shape are now exposed. Consequently, the user can read and acquire the information labeled or printed on these surfaces hidden before but now exposed.

Although the contact 55 of the USB storage unit 50 is visible, it is still in the recess 56 and can not be ready for use now. In order to access the USB storage unit 50, the user may further fold the puzzle about the folding lines 30, 32 until the puzzle 10 turns into a fourth shape (not shown). In this case, the cutting line 24 again forms the outermost edge of the deformed puzzle, and the contact 55 is exposed and ready for use.

In other words:

The information carrying device may comprise a device body formed by a puzzle, which can be folded into a plurality of different shapes. The device body may include:

a middle portion 111 that is substantially rectangular having a first and a third side that are opposite to each other and a second and a fourth side that are opposite to each other;

a first cutting line 34 that extends parallel to the first side and divides the middle portion 111 in a first middle portion half 111' and a second middle portion half 111" that have the same dimensions;

a left portion 110 that is connected to the middle portion 111 via a fold line 30 at the second side and that extends parallel to the second side and that includes:

a left middle portion 121 a left top portion 120 that is connected to the left middle portion 121 via a fold line 20 that is parallel to the first cutting line 34 a left bottom portion 122 that is connected to the left middle portion 121 via a fold line 22 that is parallel to the first cutting line 34;

a right portion 112 that is connected to the middle portion 111 via a fold line 32 at the fourth side that extends parallel to the fourth side and that includes:

a right middle portion 121' a right top portion 120' that is connected to the right middle portion 121' via a fold line 20' that is parallel to the first cutting line 34 a right bottom portion 122' that is connected to the right middle portion 121 via a fold line 22' that is parallel to the first cutting line 34;

the information carrying device further comprises a USB storage unit that is carried by the left middle portion 121 and that is hidden and is invisible from outside when the device body in a first shape, and that can be exposed and ready to interface with an information reader when the device body is in a second shape. The conversion form the first shape to the second shape is illustrated in FIGS. 4A-4E.

Figure 5:
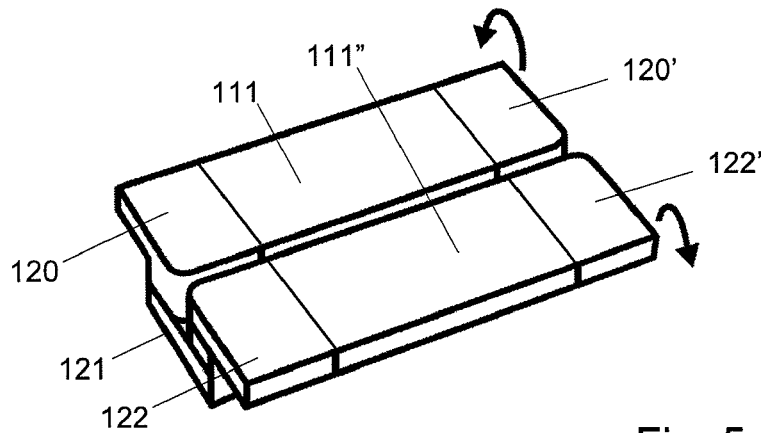
FIG. 5 shows the third shape.

FIG. 5 depicts the third shape and is the opposite side than depicted in FIG. 1C.

It is understood by one skilled in the art that the original shape of the puzzle is not limited to a cuboid shape; or rather, other shapes such as cylindrical, conical or prismatic can be also used. Meanwhile, the detailed structure of the puzzle and the particular position of the USB storage unit 50 in the puzzle are not essential to the invention. They can be freely selected as needed.

It is recognized by those skilled in the art that changes may be made to the above-described embodiment of the invention without departing from the broad inventive concept thereof. It is therefore understood that this invention is not limited to the particular embodiment disclosed, but is intended to cover all modifications which are in the spirit and scope of the invention.

The invention claimed is:

1. An information carrying device, comprising a device body formed by a puzzle, which is capable of being folded into a plurality of different shapes, the device body including:
   a middle portion that is substantially rectangular having a first and a third side that are opposite to each other and a second and a fourth side that are opposite to each other;
   a first cutting line that extends parallel to the first side and divides the middle portion in a first middle portion half and a second middle portion half that have the same dimensions;
   a left portion that is connected to the middle portion via a fold line at the second side and that extends parallel to the second side and that includes:
   a left middle portion;
   a left top portion that is connected to the left middle portion via a fold line that is parallel to the first cutting line;
   a left bottom portion that is connected to the left middle portion via a fold line that is parallel to the first cutting line;
   a right portion that is connected to the middle portion via a fold line at the fourth side that extends parallel to the fourth side and that includes:
   a right middle portion;
   a right top portion that is connected to the right middle portion via a fold line that is parallel to the first cutting line;
   a right bottom portion that is connected to the right middle portion via a fold line that is parallel to the first cutting line;
   the information carrying device further comprising:
   a USB storage unit that is carried by the left middle portion, and that is hidden and is invisible from outside when the device body is in a first shape, and that is exposed in a second shape.

2. The information carrying device according to claim 1, wherein surfaces of the device body portions of the puzzle are labeled or printed with advertising information thereon.

3. The information carrying device according to claim 1, wherein the USB storage unit contains multimedia information for advertising.

4. The information carrying device according to claim 1, wherein the device body of the puzzle includes a plurality of cutting lines that separate the portions of the device body and that, together with the folding lines, enable the puzzle to be turned into different shapes.

5. The information carrying device according to claim 2, wherein the USB storage unit contains multimedia information for advertising.

6. The information carrying device according to claim 1, wherein the device body of the puzzle is rectangular box shaped when it is in the first shape.

* * * * *